United States Patent [19]

Fujikura et al.

[11] Patent Number: 5,300,401
[45] Date of Patent: Apr. 5, 1994

[54] PHOTOPOLYMERIZABLE RESIN MATERIAL AND PROCESS FOR PREPARING PRINT CIRCUIT USING THE MATERIAL

[75] Inventors: Sadao Fujikura; Masayuki Iwasaki, both of Shizuoka, Japan

[73] Assignee: Fuji Photo Film Co., Ltd., Kanagawa, Japan

[21] Appl. No.: 73,462

[22] Filed: Jun. 9, 1993

[30] Foreign Application Priority Data

Jun. 9, 1992 [JP] Japan .................................. 4-149395

[51] Int. Cl.$^5$ ................................................. G03C 1/76
[52] U.S. Cl. ..................................... 430/271; 430/281; 430/910
[58] Field of Search ........................ 430/271, 281, 910

[56] References Cited

U.S. PATENT DOCUMENTS

| 3,884,693 | 5/1975 | Bauer et al. | 96/15 |
| 5,030,548 | 7/1991 | Fujikura et al. | 430/281 |

*Primary Examiner*—Jack P. Brammer
*Attorney, Agent, or Firm*—Sughrue, Mion, Zinn, Macpeak & Seas

[57] ABSTRACT

The photopolymerizable resin material of the present invention includes (1) a support, (2) a water soluble intermediate layer of 0.1 to 50 μm in thickness superposed on the support and (3) a photopolymerizable resin layer superposed on the intermediate layer which contains at least one carboxyl group-containing binder in an amount of from 40 to 90% by weight based on the solid content in the photopolymerizable resin layer, wherein the intermediate layer includes a cellulose derivative which has a polymerization degree of from 20 to 1,000 and is selected from the group consisting of an aqueous alkali solution soluble hydroxyalkyl cellulose, carboxyalkyl cellulose and cellulose ether. The present invention is also directed to a process for preparing a printed circuit which includes laminating the photopolymerizable material on a board, peeling off the support and then effecting pattern exposure and development.

8 Claims, No Drawings

PHOTOPOLYMERIZABLE RESIN MATERIAL AND PROCESS FOR PREPARING PRINT CIRCUIT USING THE MATERIAL

FIELD OF THE INVENTION

This invention relates to a novel photopolymerizable resin material having improved resolution and workability, in which a water soluble intermediate layer is interposed between a support and a photopolymerizable resin layer. The present invention also relates to a process for the preparation of a printed circuit to which the resin material is applied. More particularly, the present invention relates to an alkali-developable photopolymerizable resin material having such excellent properties that it can be applied suitably to a dry film photoresist or photomask, a lithographic plate, a resin relief plate and the like for use in the preparation of printed boards, that its support can be peeled automatically prior to exposure and that it can give a high level of resolution under broad exposure and development conditions.

BACKGROUND OF THE INVENTION

In recent years, dry film resists have been widely used in the field of print board making. There are two background art processes for the preparation of dry film resists; that is, tenting and plating processes. In both of these processes, techniques for making fine patterns have been improved rapidly and, as a result, great concern has been directed toward the development of a dry film resist having a higher level of resolution. With the aim of satisfying such a demand, dry film resists capable of yielding high resolution levels have been put on the market.

For example, attempts have been made to obtain high resolution levels by thinning down the thickness of support films and photopolymerizable resin layers. Though thinning of a support film can improve the resolution to a certain degree, such a thinning process has a workability problem in that the thin support film is apt to be torn-off at the time of support peeling. Thinning of a photopolymerizable resin layer is also effective for improving the resolution, but has disadvantages in that a tented membrane becomes weak and a thick plating cannot be effected.

It is also known that high resolution levels can be obtained by improving the photopolymerizable resin layers. For example, a high level of resolution can be effected by making use of a photopolymerizable resin layer. Such has been disclosed by the present inventors in U.S. Pat. No. 5,030,548. Certainly, a higher level of resolution than that of the background art dry film resist can be stably obtained when such a photopolymerizable resin layer type is used (at least at a small prototype production scale). In a large scale production line, however, exposure, development and like conditions are not always constant because of the production of a considerably large number of boards. Illustrative examples of such irregular conditions include a decrease in the quantity of light due to the deterioration of the light source during an exposure step and changes in the development load due to the changed exhaustion degree of a developing solution during a development step. In such steps (in which momentary changes in these conditions are unavoidable), it is difficult to maintain a maximum resolution level by constantly controlling optimum conditions.

Consequently, it is important to provide a stable high resolution level for the purpose of satisfying the recently increasing demand for high resolution levels. That is, it is especially important for a dry film resist to be able to provide a high level of resolution over a broad exposure and development controlling range.

On the other hand, in the general case of the background art dry film resist, a resist pattern is formed on a board by laminating the resist on the board, effecting exposure through a support, peeling the support from the board and then developing the pattern. In such a process, the support peeling step is carried out by hand, thus entailing an increase in the personnel expenditure.

With the aim of overcoming such a problem by providing a support which can be peeled automatically by a machine and, at the same time, improving the resolution to a relatively higher level, JP-A-2-213849 (the term "JP-A", as used herein, means an "unexamined published Japanese patent application") proposes a process in which a specific polyvinyl alcohol intermediate layer made of a saponification product of a polyethylene glycol/vinyl acetate graft polymer is interposed between a support and a photopolymerizable resin layer, and the support is peeled off prior to the exposure step.

In addition, with the aim of achieving the same purpose, JP-A-63-197942 discloses the use of a carboxylated polyvinyl alcohol as an intermediate layer. It is considered in general that, for the purpose of shutting-off oxygen which inhibits photopolymerization, polyvinyl alcohols are desirable as water soluble polymers for use in such an intermediate layer (which is used in combination with a photopolymerizable resin layer).

These polymers, however, are not realistic because they are particular modified polymers, they cannot be obtained easily in general, and they have a high production cost. Also, being high in hygroscopicity and low in Tg (glass transition point), these polymers have a strong tendency to increase the peeling strength of the support during a period between the lamination and support-peeling steps. An increase in the peeling strength makes it difficult to effect automatic peeling and, in some cases, finally results in such a condition that the support is split into fragments which remain on the board side.

When the board side portion remains as it is after peeling of the support, so-called "reticulation" is apt to occur in which the intermediate layer swells by absorbing moisture and presses its lower photopolymerizable resin layer subsequently causing formation of a network distortion which spoils transparency of the resin layer. Generation of such a reticulation phenomenon deteriorates the resulting resolution considerably.

In addition, U.S. Pat. No. 3,884,693 discloses gelatin, polyvinyl alcohol, polyvinyl pyrrolidone and like polymers to be used as the intermediate layer. Each of these polymers, however, has the aforementioned disadvantages and, therefore, is not satisfactory in obtaining a practically useful intermediate layer.

Also, JP-B-46 2121 (the term "JP-B", as used herein, means an "examined Japanese patent publication") discloses celluloses, carboxylalkyl starch, ethylene oxide polymers and the like as the source of the intermediate layer, in addition to the aforementioned polymers. However, the specification and examples of this patent publication do not describe the effects of these materials as a solution to various problems involved in the aforementioned applications.

SUMMARY OF THE INVENTION

In view of the above, an object of this invention is to provide a photopolymerizable resin material which is capable of maintaining a substantially high resolution level over broad exposure and development conditions in a printed board production process, especially a low cost photopolymerizable resin material containing an intermediate layer which is possessed of such properties that (1) a support can be peeled off easily by an automatic means after lamination on a board and before the exposure step, (2) peeling strength does not increase during the period before peeling of the support, (3) reticulation does not occur even when the support-peeled remainder is left alone as it is, and (4) sensitivity of a photopolymerizable layer does not decrease.

The inventors of the present invention have conducted intensive studies and found a photopolymerizable resin material which is able to satisfy the aforementioned objects.

In accordance with the present invention, there is provided a photopolymerizable resin material which comprises at least (1) a support, (2) an intermediate layer having a thickness of 0.1 to 50 μm superposed on the support, and (3) a photopolymerizable resin layer containing at least one carboxyl group-containing binder in an amount of from 40 to 90% by weight based on the solid content in the photopolymerizable resin layer, superposed on the intermediate layer, wherein the intermediate layer comprises a cellulose derivative which has a polymerization degree of from 20 to 1,000 and is selected from the group consisting of an aqueous alkali solution soluble hydroxyalkyl cellulose, carboxyalkyl cellulose and cellulose ether.

Other objects and advantages of the present invention will be clear from the following disclosure.

DETAILED DESCRIPTION OF THE INVENTION

A preferred support to be used in the present invention should be one which has sufficient mechanical properties and adhesive strength to the intermediate layer. However, the adhesive strength between the intermediate layer and the photopolymerizable resin layer should be greater than the additive strength of the support to the intermediate layer. Examples of such types of supports include a polyester film, a polyethylene film, a polypropylene film, a polyimide film, a vinyl polymer film, a cellulose ester film and the like, of which a film of polyethylene terephthalate is particularly preferred.

The support may have a thickness of preferably from 10 to 100 μm, more preferably from 15 to 30 μm.

The cellulose derivative is selected from the group consisting of an aqueous alkali solution soluble hydroxyalkyl cellulose, carboxyalkyl cellulose and cellulose ether.

Particular cellulose derivatives to be used in the intermediate layer of the present invention include ethyl cellulose, hydroxyethyl cellulose, hydroxypropyl cellulose, hydroxypropylmethyl cellulose, carboxyethyl cellulose, carboxypropyl cellulose, a water soluble salt of carboxyethyl cellulose, a water soluble salt of carboxypropyl cellulose and the like, with hydroxyethyl cellulose, hydroxypropyl cellulose and hydroxypropylmethyl cellulose being preferred, most preferred being hydroxypropylmethyl cellulose.

Each of these celluloses must have a polymerization degree of from 20 to 1,000, most preferably, from 40 to 500. The degree of polymerization, if larger than 1,000, would cause difficulty in applying an aqueous solution of the cellulose due to increased viscosity and would also entail a prolonged development time. On the other hand, the polymerization degree, if smaller than 20, would result in a weak film strength and further cause film breakage at the time of peeling the PET (polyethylene terephthalate) to be used as the support.

If necessary, a broad range of well known water soluble polymers may be used in the intermediate layer of the present invention with the cellulose derivative, such as polyvinyl alcohol, water soluble salts of polyvinyl ether/maleic anhydride, water soluble salts of carboxyalkyl starch, polyvinyl pyrrolidone, polyacrylamide, polyamide, water soluble salts of polyacrylic acid, gelatin, polyethylene glycol, polypropylene glycol and the like.

Though not particularly limited, these water soluble polymers may be blended with the cellulose derivative of the present invention in an amount of preferably from 0 to 70%, more preferably from 0 to 40% based on the amount of the cellulose derivative.

Formation of the intermediate layer may be effected generally by dissolving a water soluble cellulose in water which may contain a small amount of an organic solvent and then coating and drying the resulting solution on a support such a polyethylene terephthalate.

Arrangement of a photopolymerizable resin layer adjacent to the intermediate layer may be effected by applying an organic solvent solution of a photopolymerizable resin to the surface of the water soluble intermediate layer formed on the support, thereby making a laminated layer of the resin. Alternatively, the photopolymerizable resin layer may be applied to the intermediate layer by coating the photopolymerizable resin layer on a second support and then sticking the resulting laminate on the intermediate layer.

Taking influences on resolution and development capacities as well as dryness and like conditions into consideration, the intermediate layer must have a small membrane thickness in the range of from 0.1 to 50 μm, more preferably from 0.5 to 5 μm. The thickness, if smaller than 0.1 μm, would bear insufficient shut off capacity and reticulation-preventing effect as required properties of the intermediate layer, and, if larger than 50 μm, would cause problems in terms of the developing capacity and resolution.

Thickness of the photopolymerizable resin layer may vary depending on the type of the process for the production of printed boards, but is not particularly limited in terms of its combination with the intermediate layer of the present invention. Preferably, a thickness in the range of from 10 to 100 μm may be employed.

Preferred examples of carboxyl group-containing binders to be used in the photopolymerizable resin layer of the present invention include a copolymer of (meth)acrylic acid with a (meth)acrylic acid alkyl ester, a copolymer of (meth)acrylic acid with styrene, poly(meth)acrylic acid and a copolymer of styrene with an unsaturated dibasic acid anhydride such as maleic anhydride, as well as reaction products of these polymers with alcohols. These polymers and their reaction products with alcohols are disclosed for instance in JP-B-59-44615, JP-A-60-15973, JP-A-60-258539, JP-A-61-169829, JP-A-61-213213 and JP-A-63-147159.

Of the carboxyl group-containing binders described above, the copolymer disclosed in JP-A-60-258539, which is composed of methacrylic acid, methyl methacrylate, benzyl methacrylate and 2-ethylhexyl acrylate is most preferably used as the binder of the present invention.

These carboxyl group-containing binders may be used alone or as a mixture of two or more. In the latter case, two or more polymers which have good compatibility and are stable during the production process from the preparation step of a coating solution to its coating and drying steps may be selected and mixed in an appropriate mixing ratio.

The weight average molecular weight of the polymer to be used as the carboxyl group-containing binder of the present invention may vary widely depending on the type of the polymer, but may generally be in the range of from 5,000 to 2,000,000, preferably from 10,000 to 200,000, more preferably from 40,000 to 85,000. Generally, if the molecular weight is smaller than 5,000, an insufficient dynamic strength of a resist obtained by photopolymerization would result and, if larger than 2,000,000, the developing ability would be spoiled.

The carboxyl group-containing binder must be used in an amount of from 40 to 90% by weight, preferably from 50 to 70% by weight, based on the solid content in the photopolymerizable resin layer. The amount, if smaller than 40% by weight, would frequently cause reticulation and edge fusion due to too high fluidity of the photopolymerizable material and, if larger than 90% by weight, would not have a good image quality because of too small a difference in the solubility between the exposed and unexposed portions.

Though not particularly limited, background art (meth)acrylic acid esters disclosed, for instance, in JP-A-60-258539 and Japanese Patent Application No. 1-91247 may be preferably used as photopolymerizable monomers in the photopolymerizable resin layer of the present invention.

Illustrative examples of such monomers include (meth)acrylic acid esters of polyols, including diethylene glycol di(meth)acrylate, triethylene glycol di(meth)acrylate, tetraethylene glycol di(meth)acrylate, nonaethylene glycol di(meth)acrylate, tetradecaethylene glycol di(meth)acrylate, nonapropylene glycol di(meth)acrylate, dodecapropylene glycol di(meth)acrylate, trimethylolpropane tri(meth)acrylate, tri(meth)acrylate of an ethylene oxide addition product of trimethylolpropane, pentaerythritol di(meth)acrylate, pentaerythritol tri(meth)acrylate, pentaerythritol tetra(meth)acrylate, dipentaerythritol hexa(meth)acrylate, glycerol di(meth)acrylate, 1,3-propanediol di(meth)acrylate and the like.

Examples of (meth)acrylamides include, in addition to methylenebis(meth)acrylamide, poly(meth)acrylamides derived from ethylenediamine, diaminopropane, diaminobutane, pentamethylenediamine, bis(2-aminopropyl)amine, diethylenetriaminediamine, phenylenediamine, diaminobenzoic acid and the like.

Examples of allyl compounds include diallyl esters of phthalic acid, malonic acid and the like and diallyl esters of benzenedisulfonic acid, 2,5-dihydroxydisulfonic acid and the like.

Examples of vinyl ether compounds include ethylene glycol divinyl ether, 1,3,5-tri-$\beta$-vinyloxy ethoxybenzene and the like.

Examples of vinyl esters include divinyl succinate, divinyl adipate and the like.

Examples of styrene compounds include divinylbenzene, p-allylstyrene and the like.

Also useful in the present invention is a multifunctional urethane compound having at least two ethylenic unsaturated groups, which can be obtained by allowing a polyol compound having at least two hydroxyl groups to react with a slight excess amount of a polyisocyanate compound having at least two isocyanate groups, and then allowing the thus obtained reaction product to react with a compound having at least one hydroxyl group and at least one ethylenic unsaturated group.

The photopolymerizable monomer may be used in an amount of from 10 to 60% by weight, preferably from 25 to 50% by weight, based on the solid content in the photopolymerizable resin layer. The amount, if smaller than 10% by weight, would not have a good image quality because of too small a difference in the solubility between the exposed and unexposed portions and, if larger than 60% by weight, would frequently cause reticulation and edge fusion due to too high a fluidity of the photopolymerizable material.

Examples of the photopolymerization initiator to be used in the present invention include at least one lophine dimer, aromatic ketones, benzoin and benzoin ethers, polyhalogens and the like. Illustrative examples of preferred lophine dimers include those disclosed, for instance, in JP-B-45-37377, JP-B 48-38403, JP-A-56-35134 and Japanese Patent Application No. 63-200605, such as 2-(o-chlorophenyl)-4,5-dipheny limidazole dimer, 2-(o-chlorophenyl) 4,5-di(m-methoxyphenyl)imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer and the like.

The photopolymerization initiator to be used in the photopolymerizable resin layer of the present invention may preferably contain lophine dimers which are effective in improving the resolution of photopolymerizable resin layers as disclosed in JP-A-2-48664.

Illustrative examples of aromatic ketones include benzophenone, 4,4'bis(dimethylamino)benzophenone, 4,4'-bis(diethylamino)benzophenone, 4-methoxy-4'-dimethylaminobenzophenone, 4,4'-dimethoxybenzophenone, 4-dimethylaminobenzophenone, 4-dimethylaminoacetophenone, benzyl, anthraquinone, 2-tert-butylanthraquinone, 2-methylanthraquinone, xanthone, thioxanthone, 2-chlorothioxanthone, 2,4-diethylthioxanthone, fluorenone, acridone and the like.

Illustrative examples of benzoin and benzoin ethers include benzoin methyl ether, benzoin ethyl ether, benzoin isopropyl ether, benzoin phenyl ether and the like.

Illustrative examples of polyhalogen compounds include carbon tetrabromide, phenyl tribromomethylphenyl sulfone, phenyl trichloromethyl ketone and the like, as well as those compounds disclosed for instance in JP-A 53-133428, JP-B-57-1819, JP-B-57-6096 and U.S. Pat. No. 3,615,455.

Of the above compounds, particularly preferred examples are 4,4'-bis(dimethylamino)benzophenone, 4,4'-bis(diethylamino)benzophenone, 2,4-diethylthioxanthone, a combination of 4,4'-bis(diethylamino)benzophenone with benzophenone and a combination of 4,4'-bis(diethylamino)benzophenone with phenyl tribromomethylphenyl sulfone.

The photopolymerization initiator system may be used in an amount of preferably from 0.1 to 20% by weight, more preferably from 0.2 to 10% by weight, based on the solid content in the photopolymerizable resin layer.

In addition to the aforementioned components, if necessary, various other components may be used jointly in the photopolymerizable resin layer of the present invention, such as a heat polymerization inhibitor, a plasticizer, a coloring matter, a discoloration agent, an adhesion improving agent and the like. Joint use of these additional components renders possible the preparation of a wide variety of photoresists, resin relief plates, lithographic plates, photomasks and the like.

Heat polymerization inhibitors are used in order to prevent thermal or periodical polymerization of the photopolymerizable material, thereby effecting improvement of chemical stabilities of the photopolymerizable material at the time of its preparation and during its preservation period until its lamination on a metal plate. Illustrative examples of the heat polymerization inhibitor include p-methoxyphenol, hydroquinone, benzoquinone, o-toluquinone, p-toluquinone, t-butylcatechol, pyrogallol, 2-hydroxybenzophenone, 4-methoxy-2-hydroxybenzophenone, cuprous chloride, phenothiazine, fluoranil, chloranil, naphthylamine, pyridine, p-toluidine, $\beta$-naphthol, 2,6-di-t-butyl-p-cresol, nitrobenzene, dinitrobenzene, picric acid, aluminium or ammonium salt of N-nitrosophenylhydroxylamine, Methylene Blue organic copper, methyl salicylate, arylphosphite and the like.

The heat polymerization inhibitor may be used in an amount of preferably from 0.001 to 10% by weight, more preferably from 0.01 to 3% by weight, based on the solid content in the photopolymerizable resin layer.

Plasticizers are used for the purpose of controlling membrane qualities and other physical properties of the photopolymerizable material before and after its photo curing, as well as its photopolymerization capacity. Illustrative examples of the plasticizers include: phthalic acid esters such as dibutyl phthalate, diheptyl phthalate, dioctyl phthalate, diallyl phthalate and the like; glycol esters such as triethylene glycol diacetate, tetraethylene glycol diacetate and the like; acid amides such as p-toluenesulfonamide, benzenesulfonamide, N-n-butylbenzenesulfonamide and the like; aliphatic dibasic acid esters such as diisopropyl adipate, dioctyl azelate, dibutyl maleate and the like; and tributyl citrate, glycerol triacetate, dioctyl butyl lauryl 4,5-diepoxycyclohexane-1,2-dicarboxylate and the like.

The plasticizer may be used in an amount of preferably from 0.001 to 50% by weight, more preferably from 0.01 to 20% by weight, based on the solid content in the photopolymerizable resin layer.

Coloring matters are used to color the photopolymerizable resin layer. Illustrative examples of the coloring matters include Malachite Green, Methyl Green, Brilliant Green, Methyl Violet, Crystal Violet, Ethyl Violet, Victoria Pure Blue BOH, Oil Blue #603 (Orient Kagaku Kogyo Co., Ltd.), Eosine, Erythrocin B, Rose Bengale, Rhodamine B, Rhodamine 6G, 2,7-dichlorofluorescein, phenolphthalein, Alizarin Red S, Thymolphthalein, Quinaldine Red, Metanil Yellow, Thymolsulfophthalein, diphenyltriazene, Xylenol Blue, Methyl Congo Red, diphenyl thiocarbazone, Para Methyl Red, Congo Red, Benzopurpurine 4B, $\alpha$-Naphthyl Red, Nile Blue A, Phenacetalin, Para Fuchsine, Basic Fuchsine and the like.

The coloring matter may be used in an amount of preferably from 0.001 to 10% by weight, more preferably from 0.1 to 5% by weight, based on the solid content in the photopolymerizable resin layer.

Discoloration agents are used in order to obtain visible images when the photopolymerizable resin layer is exposed to light through a photomask. Illustrative examples of these agents include diphenylamine, dibenzyl aniline, triphenylamine, diethylaniline, diphenyl-p-phenylenediamine, p-toluidine, 4,4′-biphenyldiamine, o-chloroaniline, p,p′,p″-hexamethyltriaminotriphenylmethane, p,p′-tetramethyldiaminotriphenylmethane, p,p′,p″-triaminotriphenylcarbinol and the like, as well as the aforementioned coloring matters.

The discoloration agent may be used in an amount of preferably from 0.001 to 10% by weight, more preferably from 0.01 to 5% by weight, based on the solid contents in the photopolymerizable resin layer.

Adhesion improving agents are used for the purpose of improving adhesive strength of the photopolymerizable material to the surface of metal plates and the like made of copper, stainless steel, anodized aluminium, silicon and the like.

Illustrative examples of these agents include: benzimidazole, benzthiazole and benztriazole disclosed in JP-B-50-9177; 2-mercaptobenzthiazole and 2-mercaptobenzimidazole disclosed in JP-A-53-702; and other compounds disclosed in JP-A-59-113432, JP-A-59-16501, JP-A-60-12543, JP-A-60-12544 and JP-A-61-172139.

The adhesion improving agent may be used in an amount of preferably from 0.001 to 10% by weight, more preferably from 0.01 to 5% by weight, based on the solid content in the photopolymerizable resin layer.

According to the photopolymerizable resin material of the present invention, a resist image is formed by laminating the material on a board, carrying out image exposure and then effecting dissolution removal of unexposed portions (development). As the developing solution, an aqueous solution containing 0.1 to 10% by weight of sodium hydroxide, potassium hydroxide, lithium hydroxide, sodium carbonate, potassium carbonate, lithium carbonate, ammonia or the like may be used. If necessary, there may be used amines which include for example: primary amines such as butylamine, hexylamine, benzylamine, allylamine and the like; secondary amines such as diethylamine, benzylethylamine and the like; tertiary amines such as triethylamine and the like; hydroxylamines such as ethanolamine, diethanolamine, triethanolamine, 2-amino-1,3-propanediol and the like; cyclic amines such as morpholine, pyridine, piperazine, piperidine and the like; basic salts of the above amines, such as sulfate, carbonate, bicarbonate, alkali metal phosphate, pyrophosphate and the like; and hydroxysalts of the above amines, such as tetramethylammonium hydroxide, choline and the like.

According to the present specification, a printed circuit is obtained by laminating the photopolymerizable resin material of the present invention on a board, peeling off the support and subsequently effecting pattern exposure and development.

The following examples are provided to further illustrate the present invention. It is to be understood, however, that the examples are for purpose of illustration only and are not to be construed as limiting the invention. In the following examples, the term "part(s)" means "part(s) by weight". All parts, percents, ratios and the like are by weight unless otherwise indicated.

EXAMPLE 1

Respective materials shown below were mixed to prepare three intermediate layer solutions and a photopolymerizable resin solution all as uniform solutions.

Intermediate layer solutions

A. aqueous 4% solution of hydroxypropylmethyl cellulose ("TC-5S" manufactured by Shin-Etsu Chemical Co., Ltd.; degree of polymerization, 340).

B. aqueous 4% solution of polyvinyl alcohol ("PVP-K90" manufactured by Kuraray Co., Ltd.; degree of saponificaton, 88%).

C. aqueous 4% solution of polyvinyl pyrrolidone ("PVP-K90" manufactured by Gokyo Sangyo Co., Ltd.).

| <Photopolymerizable resin solution> | |
|---|---|
| copolymer*[1] | 100.0 parts |
| dodecapropylene glycol diacrylate | 15.0 parts |
| tetraethylene glycol dimethacrylate | 3.5 parts |
| p-toluenesulfonamide | 1.2 parts |
| 4,4'-bis(diethylamino)benzophenone | 0.12 part |
| benzophenone | 2.3 parts |
| 2-(2'-chlorophenyl)-4,5-diphenyl imidazole dimer (25% by weight solution in dichloromethane) | 4.5 parts |
| tribromomethylphenylsulfone | 0.25 part |
| Leuco Crystal Violet | 0.25 part |
| Malachite Green | 0.02 part |

*[1]35% by weight solution of a copolymer composed of methyl methacrylate, methacrylic acid, 2-ethylhexyl acrylate and benzyl methacrylate (molar ratio, 55/28/12/5; weight average molecular weight, 80,000) dissolved in a solvent system of methyl ethyl ketone/1-methoxy-2-propanol = 2/1.

Each of the three intermediate layer solutions prepared above was applied to the surface of a polyethylene terephthalate support having a thickness of 20 $\mu$m and then dried at 100° C. for 2 minutes to obtain respective intermediate layers having a thickness of about 2 $\mu$m. To each of the thus prepared intermediate layers was applied the photopolymerizable resin solution which was subsequently dried in the same manner to obtain a photopolymerizable resin layer having a thickness of 40 $\mu$m. On the thus obtained photopolymerizable resin layer was superposed a polyethylene film of 30 $\mu$m in thickness as a cover film. For use in comparative experiments, a sample was prepared by applying the photopolymerizable resin solution directly to the polyethylene terephthalate support.

Evaluation of support peeling strength

After removing the cover film, the photopolymerizable resin layer was laminated on a cleaned copper-laminated plate (35 $\mu$m in copper layer thickness and 5 cm in width) at a rate of 1 m/min and at a temperature of 105° C. After allowing the resulting sample to stand still for 15 minutes under conditions of 23° C. in temperature and 65% in humidity, the support was peeled off using a tensile strength tester ("Tensilon" manufactured by Orientec Co., Ltd.) at a rate of 50 cm/min and at a peeling angle of 180° to measure peeling strength. The results are shown in Table 1.

Evaluation of reticulation

After laminating the photopolymerizable resin layer on the copper-laminated plate in the same manner as described above, the support was peeled off immediately and changes in the surface of the intermediate layer were observed with the naked eye for 4 days under conditions of 23° C. in temperature and 65% in humidity. When generation of reticulation was not found 4 days after the peeling, the observation was recorded as "no generation". The results are shown in Table 1.

Evaluation of maximum resolution

After laminating the photopolymerizable resin layer on the copper-laminated plate in the same manner as described above, the support was peeled off immediately and exposure was effected within a range of from 30 to 200 mj/cm$^2$ using a 5 kw ultra high pressure mercury lamp ("HMW-532D" available from ORC Co., Ltd.). The exposure was carried out through a test pattern of line/space = 1:1 which had been prepared at 5 $\mu$m intervals with varied line widths of 15, 20, ..., 95 and 100 $\mu$m (each width formed one block of five lines). After 15 minutes of the exposure, spray development was carried out for 40 seconds with a 1% aqueous solution of sodium carbonate (30° C.), followed by 40 seconds of washing with water (20° C.). After drying, the resulting board was observed under a light microscope, and a minimum line width showing no twisted line or blocked space portion was judged as the maximum resolution. The results are shown in Table 2. In this instance, in Comparative Example 4, a sample prepared by coating the photopolymerizable resin layer directly on the support was used, and the exposure was carried out without peeling off the support.

Evaluation of optimum exposure value

An exposure value range by which the maximum resolution was obtained was judged as the optimum exposure value. The results are shown in Table 2. In Comparative Example 4, the intermediate layer was not used, and the exposure was carried out without peeling off the support.

Evaluation of optimum development time

Exposure was effected at an exposure value as the central point of the optimum exposure value, and development was carried out by varying development times in the range of from 40 to 100 seconds. A development time by which the maximum resolution was obtained was judged as the optimum development time. The results are shown in Table 2. In Comparative Example 4, the intermediate layer was not used, and the exposure was carried out without peeling off the support.

Evaluation of membrane strength

The support was peeled off without removing the cover film, and the remaining portion was cut into a width of 1 cm. Thereafter, exposure was effected from the intermediate layer side of the resulting sample at an exposure value as the central point of the optimum exposure value. The cover film was removed 30 minutes after the exposure to measure breaking strength of the membrane using a tensile strength tester at a rate of 5 cm/min. The results are shown in Table 3.

TABLE 1

| | Intermediate layer | Peeling strength (g/cm) | Reticulation |
|---|---|---|---|
| Inv. Ex. 1 | A | 3 | no generation |
| Comp. Ex. 1 | none | 10 | |
| Comp. Ex. 2 | B | 200 | generation in few minutes |
| Comp. Ex. 3 | C | 150 | generation in |

TABLE 1-continued

| Intermediate layer | Peeling strength (g/cm) | Reticulation |
|---|---|---|
| | | few minutes |

TABLE 2

| | Intermediate layer | Maximum resolution (μm) | Optimum exposure value (mj/cm²) | Optimum development time (sec) |
|---|---|---|---|---|
| Inv. Ex. 2 | A | 40 | 40–140 | 40–90 |
| Comp. Ex. 4 | none | 40 | 50–80 | 40–90 |

(In the case of the Comparative Example 4 in which the optimum exposure value was 80 mj/cm², exposure was carried out without removing the support.)

TABLE 3

| | Intermediate layer | Exposure step | Breaking strength (g/cm) |
|---|---|---|---|
| Inv. Ex. 3 | A | after support peeling | 250 |
| Comp. Ex. 5 | B | after support peeling | 250 |
| Comp. Ex. 6 | A | no support peeling | 260 |

As is evident from the results shown in Tables 1 to 3, in comparison with the background art type photopolymerizable material in which exposure is carried out without removing a support, a relatively higher resolution can be obtained over a relatively wider range of exposure values and development times when the photopolymerizable resin material of the present invention (containing the inventive intermediate layer) is used and exposure is effected after peeling off the support of the material. It is also evident that a sufficiently high membrane strength is retained without reducing the sensitivity even when the exposure is effected after peeling off the support, thus showing excellent performance of the photopolymerizable resin material of the present invention in terms of the reliability of tented film. After lamination of the material, since the peeling strength of the support does not increase with the passage of time, peeling of the support can be stably carried out. Also, since reticulation and like inconveniences do not occur in the intermediate layer after the peeling of the support, such peeling can be easily carried out by making use of an automatic peeling machine. In addition, the introduction of an intermediate layer negligibly increases expenses due to the use of markedly cheap materials in the intermediate layer.

Thus, as has been described in the foregoing, the photopolymerizable resin material of the present invention possesses various characteristic properties which are markedly superior to those of the background art counterpart.

While the invention has been described in detail and with reference to specific embodiments thereof, it will be apparent to one skilled in the art that various changes and modifications can be made therein without departing from the spirit and scope thereof.

What is claimed is:

1. A photopolymerizable resin material which comprises (1) a support, (2) an intermediate layer having a thickness of 0.1 to 50 μm superposed on said support, and (3) a photopolymerizable resin layer comprising at least one carboxyl group-containing binder in an amount of from 40 to 90% by weight based on the solid content in the photopolymerizable resin layer, superposed on said intermediate layer; wherein said intermediate layer comprises a cellulose derivative having a polymerization degree of from 20 to 1,000 and said cellulose derivative is selected from the group consisting of an aqueous alkali solution soluble hydroxyalkyl cellulose, carboxyalkyl cellulose and cellulose ether.

2. The photopolymerizable resin material according to claim 1 wherein said at least one carboxyl group-containing binder comprises methacrylic acid, methyl methacrylate, benzyl methacrylate and a 2-ethylhexyl acrylate copolymer.

3. The photopolymerizable resin material according to claim 1 wherein said cellulose derivative is hydroxypropylmethyl cellulose.

4. The photopolymerizable resin material according to claim 1 wherein said photopolymerizable resin layer further comprises a photopolymerization initiator containing at least one lophine dimer.

5. The photopolymerizable resin material according to claim 1, wherein the polymerization degree of the cellulose derivative is from 40 to 500.

6. The photopolymerizable resin material according to claim 1, wherein the thickness of the intermediate layer is from 0.5 to 5 μm.

7. The photopolymerizable resin material according to claim 1, wherein a water soluble polymer is added to the intermediate layer.

8. The photopolymerizable resin material according to claim 1 wherein said photopolymerizable resin layer further comprises a heat photopolymerization inhibitor, a plasticizer, a coloring matter, a discoloration agent and an adhesive improving agent.

* * * * *